(12) United States Patent
Staubach (10) Patent No.: US 10,107,852 B2
(45) Date of Patent: Oct. 23, 2018

(54) INTERSTRAND SHORT CIRCUIT TESTING OF STATOR WINDING BARS OF ELECTRIC MACHINES

(71) Applicant: Siemens Aktiengesellschaft, Munich (DE)

(72) Inventor: Christian Staubach, Marl (DE)

(73) Assignee: Siemens Aktiengesellschaft, Munich (DE)

( * ) Notice: Subject to any disclaimer, the term of this patent is extended or adjusted under 35 U.S.C. 154(b) by 68 days.

(21) Appl. No.: 15/021,689

(22) PCT Filed: Sep. 9, 2014

(86) PCT No.: PCT/EP2014/069143
§ 371 (c)(1),
(2) Date: Mar. 12, 2016

(87) PCT Pub. No.: WO2015/043942
PCT Pub. Date: Apr. 2, 2015

(65) Prior Publication Data
US 2017/0299646 A1    Oct. 19, 2017

(30) Foreign Application Priority Data
Sep. 24, 2013   (EP) .................... 13185685

(51) Int. Cl.
*G01R 31/11*  (2006.01)
*G01R 31/06*  (2006.01)
*G01R 31/02*  (2006.01)

(52) U.S. Cl.
CPC ............ *G01R 31/11* (2013.01); *G01R 31/025* (2013.01); *G01R 31/06* (2013.01)

(58) Field of Classification Search
CPC .......... H02K 7/09; H02K 1/187; H02K 21/22; H02K 1/2786; H02K 2201/03;
(Continued)

(56) References Cited

U.S. PATENT DOCUMENTS 5,550,631 A * 8/1996 Shapanus .................. G01J 1/04
356/300
6,035,265 A * 3/2000 Dister .................. G01R 31/343
324/765.01

(Continued)

FOREIGN PATENT DOCUMENTS

CN    101025434 A    8/2007
CN    103293450 A    9/2013
(Continued)

OTHER PUBLICATIONS

JP Office Action dated May 15, 2017, for JP patent application No. 2016516558.

*Primary Examiner* — Vinh Nguyen
(74) *Attorney, Agent, or Firm* — Beusse Wolter Sanks & Maire (57) ABSTRACT

A method and an apparatus check a multiplicity of mutually insulated strands in a stator winding bar of an electric machine. The method includes injecting a test signal, determining a first component of the test signal, and comparing at least the first component with a reference signal in order to determine damage to insulation between individual strands of the multiplicity of strands. The apparatus includes a signal source and a measuring apparatus. The method and the apparatus are particularly suitable for checking stator winding bars as are used in a generator and/or an electric motor.

17 Claims, 3 Drawing Sheets

(58) Field of Classification Search
CPC ...... H02K 2203/15; H02K 7/025; H02K 1/16; H02K 21/44; H02K 3/28; H02K 3/527; H02K 7/14; H02K 7/1853; H02K 11/26; H02K 11/33; H02K 17/28; H02K 2213/06; H02K 29/12; H02K 3/30; H02K 3/345; H02K 7/02; H02K 7/1823; H02K 3/02; G01R 31/343; G01R 31/346; G01R 31/1227; G01R 31/025; G01R 31/06; G01R 31/1218; G01R 31/34; G01R 31/1272; G01R 31/14; G01R 31/024; G01R 31/083; G01R 31/1245; G01R 31/2831; G01R 31/308; G01R 19/2513; G01R 19/2516; G01R 1/025; G01R 27/16; G01R 31/02; G01R 31/026; G01R 31/041; G01R 31/086; G01R 27/04; G01R 31/008; G01R 31/021; G01R 31/11; G01R 31/1254; G01M 3/002; G01M 3/223; G01M 3/38; G01M 7/08; H02P 23/0077; H02P 25/08; H02P 29/032; H02P 21/06; H02P 2203/05; H02P 29/0241; H02P 29/0243; G01J 3/0235; G01J 1/4228; G01L 1/242; H02J 5/005; G06F 11/008; G01N 27/20; G01N 27/82; G01N 27/904

See application file for complete search history.

(56) References Cited

U.S. PATENT DOCUMENTS

| | | | |
|---|---|---|---|
| 6,323,658 B1* | 11/2001 | Kendig | G01R 31/343 324/546 |
| 7,906,973 B1 | 3/2011 | Orr | |
| 9,255,970 B2* | 2/2016 | Neti | G01R 31/343 |
| 2004/0100272 A1 | 5/2004 | Styles | |
| 2011/0304340 A1 | 12/2011 | Hall et al. | |
| 2013/0221982 A1 | 8/2013 | Julson et al. | |
| 2014/0176152 A1* | 6/2014 | Wolbank | G01R 31/343 324/510 |

FOREIGN PATENT DOCUMENTS

| | | |
|---|---|---|
| DE | 102013202717 A1 | 8/2013 |
| EP | 2202529 A2 | 6/2010 |
| JP | H09251862 A | 10/1997 |
| JP | H09257862 A | 10/1997 |
| JP | H1054864 | 2/1998 |
| JP | H1054864 A | 2/1998 |
| JP | 201324850 A | 2/2013 |
| JP | 2013024850 A | 2/2013 |

* cited by examiner

INTERSTRAND SHORT CIRCUIT TESTING OF STATOR WINDING BARS OF ELECTRIC MACHINES

CROSS REFERENCE TO RELATED APPLICATIONS

This application is the US National Stage of International Application No. PCT/EP2014/069143 filed Sep. 9, 2014, and claims the benefit thereof. The International Application claims the benefit of European Application No. EP13185685 filed Sep. 24, 2013. All of the applications are incorporated by reference herein in their entirety.

FIELD OF INVENTION

The invention relates to a method for checking a multiplicity of mutually insulated strands in a stator winding bar of an electrical machine, and to a corresponding apparatus.

BACKGROUND OF INVENTION

In electrical machines, in particular in rotating electrical machines, such as for example motors or generators, what are known as stator winding bars are used in order to homogenize the current density within the electrical machine and to reduce induced eddy currents as far as possible. The rotating machines are constructed for this purpose from a multiplicity of partial conductors or strands. The strands are mutually insulated by means of an appropriate partial conductor insulation, as is known to the expert. Roebel-stranding of the partial conductors is furthermore a common procedure in order to minimize losses caused by induced eddy currents. In the manufacture of large electrical machines, which also can be referred to as rotating machines, it is necessary to bond the strands in order to achieve the desired insulation of the strands and thereby their electrical insulation. For this purpose the partial conductors are constructed as what is known as stator winding bars; these contain a desired degree of Roebel-stranding, and are bent if necessary. Like the bending, the desired Roebel-stranding causes mechanical stress, which can have the result that the strand insulation is damaged, and that electrical contacts can occur between individual instances of the strands of a stator winding bar. These unwanted electrical connections between strands impair the electrical insulation of the strands, and when the machine, which may be a rotating (three-phase) motor or a generator, is operating they lead to a risk of premature failure. The service life and/or the capacity of the machine is significantly impaired as a result. It is therefore of interest to detect corresponding possible damage to the strand insulation as early as the manufacturing stage. It was usual in the past to check the strands of a stator bar before the stator winding bar or the strand stator bar was consolidated at its two ends, i.e. electrically connected to the other parts of the machine. For this purpose it was usual to use a suitable measuring instrument such as a multimeter to check the stator bar or the stator winding bar for possible inter-strand short-circuits, that is to say an electrical connection between individual instances of the strands, which indicates damage to the electrical insulation between individual strands of the multiplicity of strands within the stator winding bar. It was in the past necessary to use a multimeter to check each strand against the other strands for an electrical connection, particularly a low-resistance connection.

This procedure in the prior art was very time-consuming and expensive since for one stator winding bar, which is constructed, for example, from 50 strands that are correspondingly Roebel-stranded together, it is necessary to check each strand for insulation with respect to the other strands within the stator winding bar. This means that a total of 1225 combinations of strands must be checked. 1225 measuring steps are thus necessary for a complete check. In addition to this, in the prior art the appropriate measurement using the multimeter, as described above, can only take place as long as the strands that are going to be brought together to form the stator winding bar have not yet been consolidated. That means that these measurements must already be carried out before the application of the appropriate insulation, that is before installation of the Roebel bars into the laminated stator core, since a measurement is no longer possible at a later time. As a particular consequence, early damage that occurs, for example, during transport, which only leads to low-resistance connections between the strands when subjected to additional mechanical stress, such as the pressing after installation of the bars, or Roebel bars, into the laminated core, is not detected. This means that in the prior art it could happen that the time-consuming measurement has not indicated any damage to the insulation between the strands, although said damage is present after installation has been completed.

US 2011/304340 A1 discloses a method for testing an electrical conductor for an anomaly. U.S. Pat. No. 7,906,973 B1 describes a network device with a control module and a cable test module. A method for insulating an electrical circuit in an aircraft is described in US 2004/100272 A1. EP 2 202 529 A2 discloses a method and an apparatus for cable inspection. DE 10 2013 202717 A2 describes a modular cable harness and a modular cable harness test apparatus.

SUMMARY OF INVENTION

These problems are remedied by the method according to the invention for checking a multiplicity of mutually insulated strands in a stator winding bar of an electrical machine, since through the method according to the invention, electrical connections, in particular low-resistance shorts between individual instances of the strands, can also be detected after completion of the stator winding bar. A corresponding apparatus for checking a plurality of strands in a stator winding bar of an electrical machine according to the present invention also solves the problems in the prior art.

The object of the invention is to provide a method and an apparatus for checking a multiplicity of mutually insulated strands in a stator winding bar of an electrical machine that can also check fully fabricated stator winding bars reliably for damage to the insulation between individual strands of the multiplicity of strands. It is also an advantage of the present method and of the apparatus according to the invention that an individual measurement is sufficient for checking the strands within the stator winding bar. As a result, checking a fully fabricated stator winding bar becomes less time-consuming and more economical than in the prior art.

The method according to the invention for checking a multiplicity of mutually insulated strands in a stator winding bar of an electrical machine comprises a step of injection of a test signal, a step of detection of a first component of the test signal, and a step of comparison. The step of injection of a test signal comprises an injection of the test signal into a multiplicity of strands of the stator winding bar. The step of comparison comprises, according to the invention, a comparison of at least the first component of the test signal with a reference signal, in order in this way to detect damage to an insulation, that is to say to detect a conductive separation between individual strands of the multiplicity of strands.

This method is advantageous in order to check a multiplicity of strands within the stator winding bar with only one measurement. As a result, the quality assurance of the stator winding bar becomes less expensive and less time-consuming. The term injecting refers to the introduction of a test signal into the multiplicity of strands of the stator winding bar. Suitable methods are known to the expert. The injection can thus be performed through an electrical connection, an inductive coupling and/or a capacitive coupling between a signal source and the stator winding bar, so that the stator winding bar, and thereby strands of the stator winding bar, are subjected to the test signal. The first reflection component of the test signal is to be understood as that component of the test signal that is reflected by the multiplicity of strands and can therefore be detected at the injection point or at the location of the injection.

In particular the step of detection comprises a detection of a first reflection component of the test signal and/or of a first transmission component. This gives rise to the advantage that optionally only one or two connections to the stator winding bar are necessary for checking the stator winding bar. The expert thus has freedom in respect of how the checking of the stator winding bar is to be done. In addition, the detection of the reflection component and the transmission component yields two magnitudes which can be used for error checking.

In particular the step of injection comprises an injection at a first segment of the stator winding bar or at a first end segment of the stator winding bar. It can be advantageous to perform the step of injection at a first segment of the stator winding bar that is not an end segment of the stator winding bar. This can, for example, result from circumstances of fabrication. If the test signal is injected at a first segment that is not an end segment of the stator winding bar it can mean that the strands within the stator winding bar are not checked over their full length.

It is also conceivable that the test signal is injected at a first end segment of the stator winding bar, since this end segment will be connected with other segments of the electrical machine later in the fabrication process, whereby it can be ensured that essentially the full length of the stator winding bar, which will be consolidated later, is free from damage to the insulation between individual strands of the multiplicity of strands. Due to the freedom of choice of the injection point as a first segment and/or first end segment of the stator winding bar, the method according to the invention can be adapted flexibly to the circumstances present at any one time during the fabrication process. It is furthermore advantageous to carry out the step of detection as a detection of the first reflection component at the first segment or at the first end segment of the stator winding bar. If the site of injection or the segment for injection and for detection are the same, the method according to the invention is further simplified. As a result the method according to the invention can be carried out more economically and in less time.

Furthermore the method according to the invention can comprise a termination of a second end segment of the stator winding bar. A termination of the stator winding bar at its second end has the advantage that defined reflection properties can be achieved for the strands within the stator winding bar that are not electrically connected. The termination can thus comprise a short-circuiting, a desired resistance, or a characteristic impedance of the stator winding bar.

Furthermore the step of termination comprises a termination of at least a first selection of the strands within the stator winding bar. A defined reflection behavior thus results for the first selection of the strands, provided the insulation between the strands of the first selection is not damaged. It is further advantageous for the step of termination to comprise a termination of the multiplicity of strands at the second end of the stator winding bar that are being checked by the method according to the invention. This has the advantage that the multiplicity of mutually insulated strands in the stator winding bar being checked by the method exhibit a defined reflection behavior, provided the insulation between them is not damaged. Since the number of strands within the stator winding bar is known, it can further be advantageous for all of the strands within the stator winding bar to be terminated by the desired resistance, short-circuit or characteristic impedance, in order to achieve defined reflection properties for all of the strands within the stator winding bar, provided the strands are conductively separated, which means provided the insulation between all the strands of the stator winding bar is not damaged.

In particular the step of comparison comprises a reference signal that is a superposition reference signal. The superposition reference signal is compared with a superposition signal from the first reflection component and the test signal. This procedure has the advantage that checking the strands is possible at one end of the stator winding bar. The measuring setup required for the method is thereby simplified.

Further the method can comprise an injection of the test signal into a second selection of the strands of the stator winding bar. The injection into the second selection of the multiplicity of strands can be made at a second segment, in particular at a second end segment of the stator winding bar. The method can furthermore comprise a detection of a second reflection component at the second segment or at the second end segment of the stator winding bar. The comparison can comprise a comparison of at least the second reflection component with the reference signal and/or with the first reflection component. Through this procedure, the check of the strands of the stator winding bar can be made both at its first end and at its second end. Inasmuch as the reflection components at the two segments or end segments differ from one another, this is an indication of damage to the insulation between the strands within the stator winding bar, and thus of an impaired conductive separation of these strands.

The test signal furthermore comprises a temporal voltage curve with at least one edge of defined gradient. Defined gradient is here to be understood such that sufficiently high frequency components are contained in the gradient of the edge for a possible change in the reflection component, such as can occur from damage to the insulation, to be reliably detectable.

The test signal can furthermore comprise a temporal voltage curve with at least one voltage pulse with at least one edge of defined gradient. Equally it is possible for the voltage pulse to comprise two edges with the defined gradient. Furthermore, the defined gradient can be of a few volts within a few nanoseconds or microseconds, in particular 0.1 to 10 volts per microsecond or higher. The values quoted here are only to be understood by way of example, and do not represent a limitation of the invention.

Furthermore the test signal can comprise a temporal voltage curve with at least one maximum of a few volts, in particular 0.1 to 80 volts. These features of the temporal voltage curve have the advantage that no special safety precautions have to be taken if the stator winding bar is checked using the method according to the invention. The values quoted here are only to be understood by way of example, and do not represent a limitation of the invention.

The invention further proposes an apparatus for checking a multiplicity of strands in a stator winding bar of an electrical machine. The machine comprises a signal source and a measuring apparatus. The signal source is configured to provide and inject a test signal into a multiplicity of strands of the stator winding bar. The measuring apparatus is configured to detect a reflection component and/or a transmission component of the test signal, and to analyze the reflection component and/or the transmission component in relation to a reference signal.

Further, the reference signal can be a superposition reference signal, and is with a superposition signal of the first reflection component and the test signal. A variety of possibilities are known to the expert for generating a superposition signal; the superposition signal can thus, for example, be comprised of an addition of the test signal and the reflection signal. As a result, the resulting superposition signal is reduced by the reflection component. It is equally possible for the test signal and the reflection component to be plotted against one another, in order to generate what are known as Lissajous figures. As is known, it is advantageous for this purpose for the test signal to contain appropriate alternating voltage components. Equally, other forms of superposition signals and/or superposition reference signals are known. It is advantageous to choose the superposition signal of the test signal and the reflection component in such a way that in the event of the insulation being damaged, a significant difference arises in the case of a fault from the superposition reference signal of an undamaged stator winding bar, i.e. a stator winding bar with undamaged insulation. The fault case is to be understood here as a stator winding bar in which there is at least one place where the insulation between the mutually insulated strands is damaged, so that a low-resistance short between individual instances of the strands occurs.

Further, the electrical machine is a generator. This is advantageous, since stator winding bars, such as are used in a generator, can thus be checked with the apparatus according to the invention. Without limitation, the electrical machine can also be any rotating electrical machine, such as an electric motor or the generator already mentioned. The advantage arises from this that large rotating electrical machines in particular can be checked as early as their assembly for correctness, i.e. the desired electrical insulation between individual instances of the strands. A possible power loss of the electrical machine is thereby prevented.

BRIEF DESCRIPTION OF THE DRAWINGS

Preferred embodiments of the method according to the invention and of the apparatus according to the invention are explained below with reference to the attached schematic drawing. Here.

DETAILED DESCRIPTION OF INVENTION

Figure 1A:
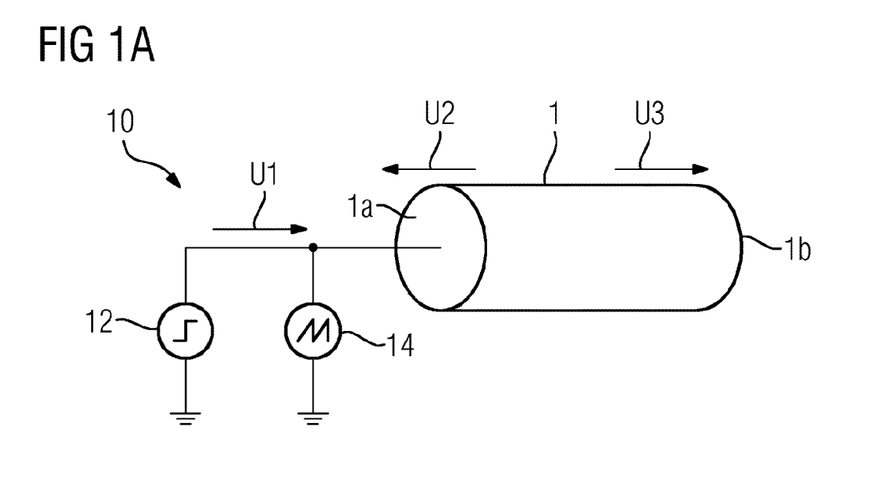
FIG. 1a shows a first arrangement for carrying out the method according to the invention.

FIG. 1 shows a first structure for carrying out the method according to the invention. For this purpose, a stator winding bar 1 is subjected at a first segment, in particular at a first end segment 1a, to a test signal U1, there being no termination or short-circuit provided at a second segment of the stator winding bar 1, in particular at its second end segment 1b. The test signal U1 can be provided by a signal source 12. The test signal U1 propagates along the stator winding bar 1. It is advantageous for the test signal U1 to be injected into a multiplicity of the strands within the stator winding bar 1, in order to be able to check a plurality of the strands with one measurement. It is possible, without limitation, for the test signal U1 to be injected into all of the strands of the stator winding bar 1.

Suitable means for the injection 100 of the test signal as the first step of the method are known to the expert. The injection 100 can thus signify, for example, an electrical connection, a capacitive injection and/or an inductive injection of the test signal U1. In FIG. 1a, the first end segment 1a of the stator winding bar 1 is shown as the segment for the injection 100. The expert will, nevertheless, understand that, without limitation, the injection 100 of the test signal U1 into the multiplicity of strands can also be done at any other segment of the stator winding bar 1. The location of the injection can therefore be selected in accordance with the nature of the specific fabrication. Due to the characteristic impedance of the stator winding bar 1, the test signal U1 will propagate along the stator winding bar 1, wherein a transmission component U3 reaches the second end 1b of the stator winding bar 1, while, due to the given characteristic impedance, a reflection component U2 is reflected to the injection segment 1a—shown in the figure as the first end segment of the stator winding bar 1.

If now, as a result of damage to a mutual insulation of the strands of the stator winding bar 1, low-resistance connections or short-circuits between individual instances of the strands of the stator winding bar 1 are present, then the characteristic impedance of the stator winding bar 1 changes at these fault locations. The change to the characteristic impedance of the stator winding bar 1 also entails a change in the reflection component U2 and in the transmission component U3. When the injection 100 of the reference signal U1 occurs at the first end segment 1a or the first segment of the stator winding bar 1, the reflection component U2 measured there can also be referred to as a first reflection component. The first reflection component U2 is detected or measured in a step of detection 200. The significant change of this first reflection component U2 in the event of a low-resistance connection between individual instances of the strands can be detected in a comparison step 300 of the method. For this purpose, the first reflection component U2 is compared with a reference signal Uref for the fault-free case, in order to detect damage to the insulation between individual instances of the strands. A measuring apparatus 14 can, for example, be used for this purpose, perhaps in the form of an oscilloscope.

The expert will understand that, on the basis of the significant change in the characteristic impedance in the case of a fault, a significant change to a transmission component U3 of the test signal U1 can also be used for the detection of damage to the insulation, i.e. low-resistance connections between individual instances of the strands. The measuring apparatus 14 could also be attached to the second end segment 1b of the stator winding bar 1 (not illustrated) to measure the transmission component U3.

Figure 1B:
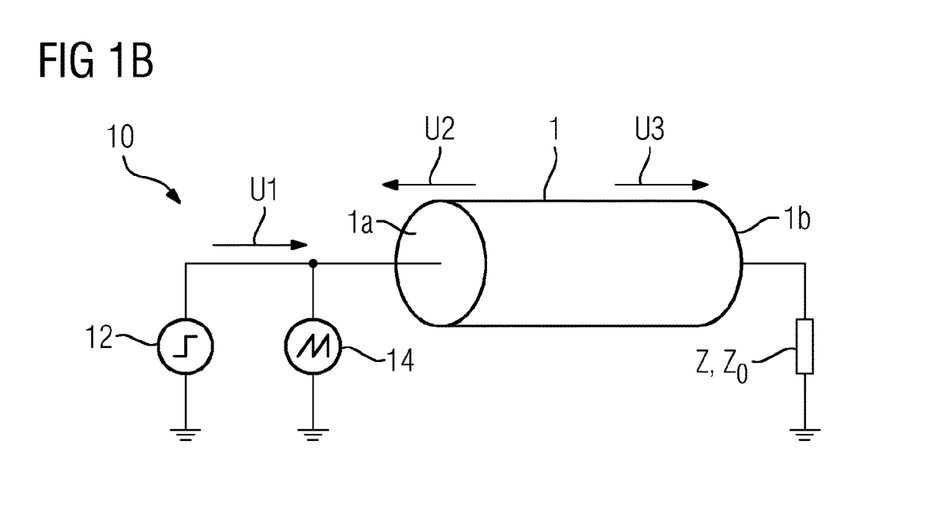
FIG. 1b shows a second arrangement for carrying out the method according to the invention.

FIG. 1b shows an alternative structure for carrying out the method according to the invention. In contrast to FIG. 1a, the second end segment 1b of the stator winding bar 1 is terminated by a resistor Z, Z0. The use of the resistor has the advantage that in the case of an undamaged insulation between the strands, a defined reflection behavior of the test signal U1 can be set up along the strands. Through the resistor Z, Z0 for example, a short-circuit to ground, or a termination by a characteristic impedance Z0 of the correctly mutually insulated strands can be achieved.

For the structure for carrying out the method according to the invention illustrated in FIGS. 1a and 1b, the test signal U1 is only injected at a first end 1a of the stator winding bar 1. It is of course possible, without limitation, in addition or alternatively to inject the test signal U1 at the second end segment 1b of the stator winding bar 1. At the second end segment 1b, the test signal U1 is injected into at least one second selection of the strands of the stator winding bar 1.

It is advantageous for the injection 100a of the test signal U1 to be made into the same strands that were already used for the injection 100 at the first segment or end segment 1a. If the measurements for the respective reflection components U2, U2' for these two measurements differ, so that the first reflection component U2 at the first segment or end segment 1a is different from a second reflection component U2 at the second segment or end segment 1b of the stator winding bar 1, this is an indication of damage to the strands. This means that in a step of comparison 300a of the second reflection component U2' with a reference signal Uref and/or the first reflection component U2, a significant difference emerges that points to damage of the mutual insulation of the strands.

For the measuring set up illustrated in FIG. 1a and FIG. 1b, a test signal U1 of a few volts, with a defined edge gradient, is sufficient. The edge gradient should be in the range of a few volts within a few microseconds. Equally, it is possible, without further limitation, for the gradient to be in the range of a few volts per nanosecond. As is known, the sensitivity for the detection of fault locations rises with increasing gradient; this is because a broader frequency spectrum is contained in the edge as the gradient increases.

The expert will understand that in the case of a detection of the first reflection component U2 at the first end segment 1a, and of the second reflection component U2' (not illustrated) at the second end segment 1b of the stator winding bar 1, it is possible that an occurrence of damage to the insulation that is symmetrical with respect to the length of the stator winding bar 1 can be overlooked in the step of comparison 300a.

Figure 2A:
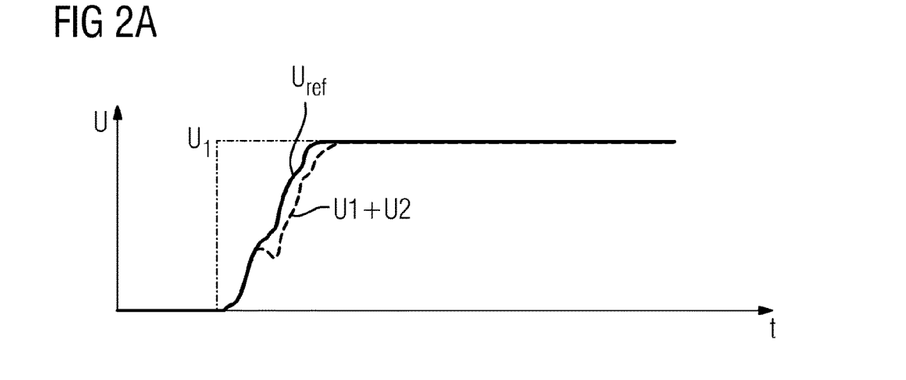
FIG. 2a shows an exemplary plot of reference signals Uref and reflection components in the case of a superposition signal U1+U2.

FIG. 2a illustrates by way of example a plot of a superposition signal U1+U2 against time t. A characteristic signal Uref arises, as illustrated, in the case of an undamaged mutual insulation of the strands. As a result of the significant change of the reflection component U2 in the case of a damaged insulation between individual instances of the strands, a significant change occurs to the reflection component U2, both at the first end segment 1a or at the second end segment 1b of the stator winding bar 1.

It is advantageous to plot a superposition signal U1+U2 against time, since in the event of a fault, the superposition signal U1+U2 decreases, thus resulting in a significant deviation between the reference signal Uref and the superposition signal U1+U2. Further options for superposition signals are known to the expert. Without limitation it is, for example, possible for the reflection component U2, U2' detected in step 200 to be enlarged or amplified in order to make the deviation yet clearer. It is therefore possible to select suitable representations, such that a significant difference between the fault-free stator winding bar and a faulty stator winding bar results in the step of comparison 300a.

Figure 2B:
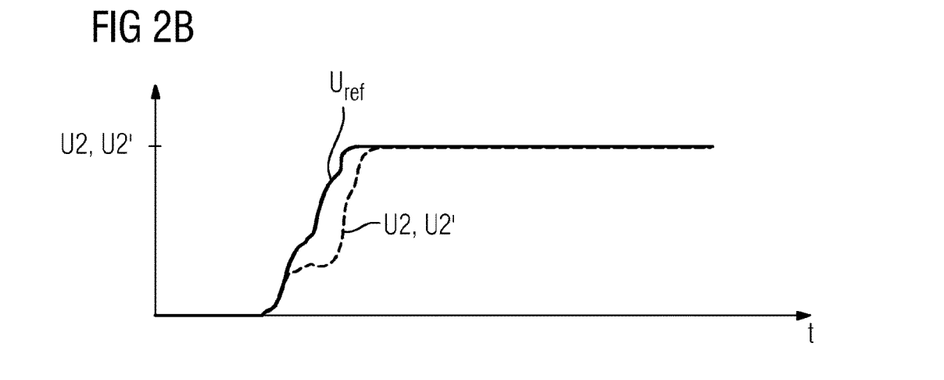
FIG. 2b shows a schematic signal plot of the reference signal Uref for the reflection component in the case of an undamaged insulation and of a faulty insulation.

FIG. 2b shows, by way of example, a plot of the first or second reflection signal U2, U2' against time. As a result of the significant change to the characteristic impedance in the event of a damaged insulation, a significant difference (as shown) arises between the reference signal Uref and the first or second reflection component U2, U2'. This significant difference can be used to detect damage to the insulation between individual instances of the strands in the step of comparison 300, 300a of a desired reference signal with the respective reflection components U2, U2'.

It is also without limitation possible, in the step of detection 200, to use the measured transmission component U3 at the respectively opposite segment or end segment of the stator winding bar 1, which is not used for injection, for detection of damage to the mutual insulation of the strands of the stator winding bar, in the place of the first reflection component U2 or of the second reflection component U2'. The significant change to the characteristic impedance in the case of a low-resistance connection between individual strands also has an effect on the transmission component U3.

Further possibilities are known to the expert for generating a superposition signal from test signal U1, its reflection component U2, U2' and/or the transmission component U3 in order to achieve a significant difference at the step of detection 300, 300a between an undamaged insulation and a damaged insulation. Illustrations of selected signals from the test signal U1, the reflection component U2, U2' and/or the transmission component U3 against one another in the form of Lissajous figures are conceivable, for example. The signal curves shown in FIGS. 2a and 2b are to be understood as merely exemplary, and on no account as restricting the method of the invention or the apparatus 10.

Methods are moreover known to the expert for preparing templates from signal curves to be expected for the case of a fault and the fault-free case, so that it may be possible to distinguish between the two cases automatically.

Figure 3:
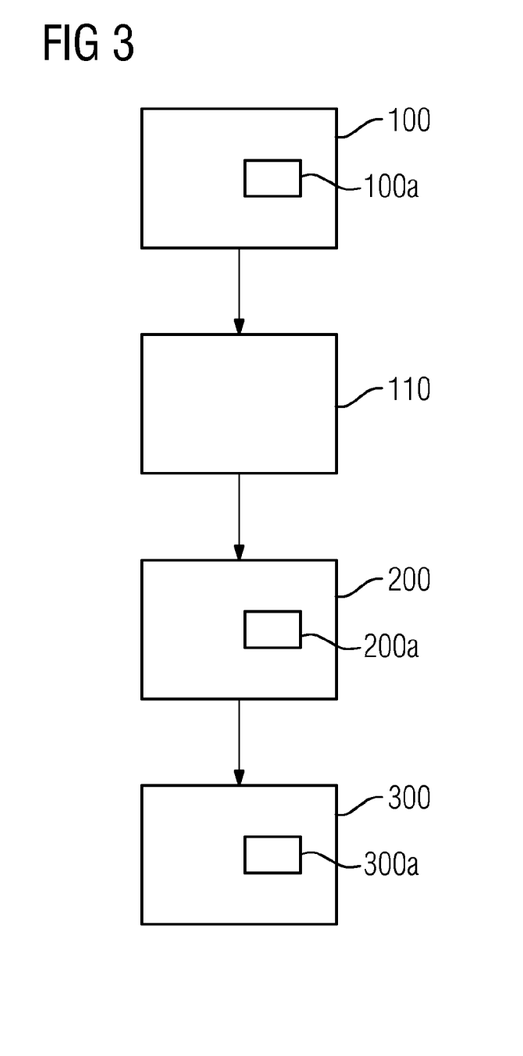
FIG. 3 shows a flow diagram of the method according to the invention.

FIG. 3 shows a flow diagram of the method according to the invention for checking a multiplicity of mutually insulated strands of the stator winding bar 1. In a step 100 of the injection, a test signal U1 is injected into the plurality of strands of the stator winding bar 1. The multiplicity of strands can here comprise all of the strands present in the stator winding bar 1; it is equally possible, without limitation, that an injection in step 100 is only made into a selection of the mutually insulated strands of the stator winding bar 1. The step 100 can, alternatively or in addition, comprise a step of injection 100a of the test signal into at least a second selection of the multiplicity of strands of the stator winding bar at a second segment or at a second end segment 1b of the stator winding bar 1.

The method can, further, advantageously comprise a step 110 of the termination of a second end segment of the stator winding bar 1. The termination can be made through a short circuit, a resistor Z or the characteristic impedance Z0 of the stator winding bar 1. Typically the termination 110 is made at the end segment of the stator winding bar 1 that is not used for injection 100 of the test signal. As described, the step of termination changes the reflection behavior for the correctly mutually insulated strands. It can be advantageous for all the strands into which the test signal is injected in the step 100 also to be terminated in step 110.

According to FIG. 3 the method further comprises a step of detection 200 of a component of the test signal U1. The detection 200 can involve the detection 200 of the first reflection component U2 and/or of the transmission component U3 of the test signal U1. Equally it is optionally possible that the second reflection component U2' of the test signal U1 is detected in a step 200*a*.

In a step 300 at least the first reflection component U2 and/or the transmission component U3 is compared with a reference signal Uref in order to detect damage to an insulation between individual strands of the multiplicity of strands. Optionally, the step of comparison 300 can also comprise a comparison 300*a* between at least the second reflection component U2' and the reference signal Uref and/or the first reflection component U2. The steps 300, 300*a* of the method can comprise the possibilities of comparison described in connection with FIGS. 2*a* and 2*b*.

The apparatus 10 according to the invention for checking a multiplicity of strands in a stator winding bar 1 of an electrical machine is illustrated in FIGS. 1*a* and 1*b*.

The apparatus 10 comprises a voltage source 12 for the provision and injection of a test signal U1 into the plurality of strands of a stator winding bar 1. The apparatus 10 further comprises a measuring apparatus 14. The measuring apparatus 14 can, for example, be an oscilloscope. The measuring apparatus 14 serves to detect a reflection component U2, a second reflection component U2' and/or a transmission component U3 of the test signal U1. The measuring apparatus 14 can further permit an analysis of the reflection components U2 and/or U2' in relation to a reference signal Uref. The reference signal Uref here typically refers to a corresponding signal for a stator winding bar 1 whose insulation between the individual strands is undamaged. The apparatus 10 can further comprise means for injecting the test signal U1 into the multiplicity of strands. The appropriate means are known to the expert, and are not illustrated in FIGS. 1*a* and 1*b*. The voltage source 12 and the measuring apparatus 14 can also, without limitation, be implemented as one apparatus 10. Optionally the apparatus 10 can further comprise a resistor Z, Z0 for terminating the stator winding bar. The reference signal Uref can, without limitation, be the forms of the reference signal described above in connection with FIG. 2*a* and FIG. 2*b*.

The invention claimed is:

1. A method for checking a multiplicity of mutually insulated strands in a stator winding bar of an electrical machine, the method comprising:
   first injecting a test signal into at least a first selection of the multiplicity of strands of the stator winding bar, wherein the step of first injection comprises an injection at a first segment of the stator winding bar or at a first end segment of the stator winding bar,
   detecting a first reflection component of the first injected test signal at the first segment or at the first end segment,
   second injecting the test signal into at least a second selection of the multiplicity of strands of the stator winding bar at a second segment of the stator winding bar or at a second end segment of the stator winding bar,
   detecting a second reflection component of the second injected test signal at the second segment or the second end segment, and
   detecting damage to an insulation between individual strands of the multiplicity of strands by:
   comparing at least the first reflection component with a first reference signal, wherein the first reference signal is a superposition reference signal that is compared with a superposition signal of the first reflection component and the test signal, and
   comparing at least the second reflection component with a second reference signal, wherein the second reference signal is a superposition reference signal that is compared with a superposition signal of the second reflection component and the test signal.

2. The method as claimed in claim 1, further comprising:
   terminating a second end segment of the stator winding bar by a short circuit, a resistor or a characteristic impedance.

3. The method as claimed in claim 2,
   wherein the step of termination comprises a termination of at least a first selection of the multiplicity of strands at the second end segment of the stator winding bar.

4. The method as claimed in claim 1,
   wherein the test signal comprises a temporal voltage curve with at least one edge of a defined gradient.

5. The method as claimed in claim 4,
   wherein the defined gradient amounts to a few volts within a few nanoseconds.

6. The method as claimed in claim 5,
   wherein the defined gradient amounts to 0.1 to 10 volts per nanosecond or higher.

7. The method as claimed in claim 1,
   wherein the test signal comprises a temporal voltage curve with at least one voltage pulse with at least one edge of defined gradient.

8. The method as claimed in claim 1,
   wherein the test signal is at least one temporal voltage curve with at least one maximum of a few volts.

9. The method as claimed in claim 8,
   wherein the test signal is at least one temporal voltage curve with at least one maximum of a few volts in the range from 0.1 to 80 volts.

10. An apparatus for checking a multiplicity of strands in a stator winding bar of an electrical machine, the apparatus comprising:
    a signal source configured to provide and inject a test signal into the multiplicity of strands,
    a measuring apparatus configured to detect a first reflection component or a first transmission component of the test signal at a first segment or at a first end segment of the stator winding bar, and a second reflection component or a second transmission component of the test signal at a second segment or at a second end segment of the stator winding bar, and to compare the first or second reflection component or the first or second transmission component in relation to a reference signal, wherein the reference signal is a corresponding signal for a stator winding bar whose insulation between individual strands is undamaged.

11. The apparatus as claimed in claim 10,
    wherein the reference signal is a superposition reference signal, and is a superposition signal of the first reflection component and the test signal.

12. The apparatus as claimed in claim 10,
    wherein the electrical machine is a generator.

13. A method for checking a multiplicity of mutually insulated strands in a winding bar of an electrical machine, the method comprising:
- injecting a test signal into at least a plurality of the multiplicity of strands at a first location along the winding bar, the test signal comprising a voltage gradient;
- detecting a component of the test signal comprising a voltage gradient at a second location along the winding bar; and
- assessing a condition of insulation of the winding bar by comparing the detected voltage gradient of the component of the test signal to a corresponding reference signal voltage gradient for a winding bar whose insulation is undamaged.

14. The method of claim 13, further comprising injecting the test signal into all of the strands of the winding bar.

15. The method of claim 13, wherein the first location and the second location are both at a same end of the winding bar.

16. The method of claim 13, wherein the first location and the second location are at opposed ends of the winding bar.

17. The method of claim 13, wherein the first location is at a first end of the winding bar, and further comprising:
- terminating the multiplicity of strands at a second end of the winding bar with a short-circuiting, a resistance, or an impedance.

* * * * *